US007254066B2

(12) United States Patent
Lee

(10) Patent No.: US 7,254,066 B2
(45) Date of Patent: Aug. 7, 2007

(54) MEMORY DEVICE WITH DIFFERENT TERMINATION UNITS FOR DIFFERENT SIGNAL FREQUENCIES

(75) Inventor: Jung-Joon Lee, Bucheon-Si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/975,808

(22) Filed: Oct. 27, 2004

(65) Prior Publication Data

US 2005/0180235 A1 Aug. 18, 2005

(30) Foreign Application Priority Data

Feb. 16, 2004 (KR) ........................ 10-2004-009940

(51) Int. Cl.
*G11C 7/00* (2006.01)
*H03K 17/16* (2006.01)

(52) U.S. Cl. ........................ 365/191; 365/191; 326/28; 326/30

(58) Field of Classification Search ................ 365/191; 326/26, 28, 30
See application file for complete search history.

(56) References Cited

U.S. PATENT DOCUMENTS 3,771,064 A * 11/1973 Hebert, Jr. ..................... 333/1
6,040,714 A * 3/2000 Klein .......................... 326/86
6,097,208 A * 8/2000 Okajima et al. .............. 326/26
6,115,298 A * 9/2000 Kwon et al. ................ 365/198
6,411,122 B1 * 6/2002 Mughal et al. ............... 326/30
6,441,638 B2 * 8/2002 Osaka et al. .................. 326/30
6,472,941 B2 * 10/2002 Shigematsu ................. 330/286
6,680,623 B2 * 1/2004 Hirai et al. .................... 326/30
6,707,319 B2 * 3/2004 Yoshimura ................... 327/12
6,747,475 B2 * 6/2004 Yuffe et al. ................... 326/30
6,762,620 B2 * 7/2004 Jang et al. ..................... 326/30
6,865,399 B2 * 3/2005 Fujioka et al. ........... 455/553.1
2003/0015767 A1 * 1/2003 Emrick et al. .............. 257/528
2003/0039151 A1 * 2/2003 Matsui ....................... 365/195
2004/0210729 A1 * 10/2004 Horii et al. ................. 711/156
2005/0040845 A1 * 2/2005 Park ............................ 326/30

OTHER PUBLICATIONS

Korean Patent Application No. 10-1997-026003 to IBM Corporation, having Publication date of Jun. 5, 1998 (w/ English Abstract page).

(Continued)

*Primary Examiner*—Amir Zarabian
*Assistant Examiner*—Anthan Tran
(74) *Attorney, Agent, or Firm*—Monica H. Choi

(57) ABSTRACT

A memory device includes a first termination unit coupled to a first pin for receiving a first signal having a first frequency component. The memory device also includes a second termination unit coupled to a second pin for receiving a second signal having a second frequency component higher than the first frequency component. The first termination unit is a different type from the second termination unit that provides less signal distortion than the first termination unit. For example, the first termination unit is of an open-drain type that has less power consumption, and the second termination unit is of a push-pull type that has less signal distortion.

27 Claims, 7 Drawing Sheets

OTHER PUBLICATIONS

Korean Patent Application No. 10-2000-002365 to IBM Corporation, having Publication date of Aug. 25, 2000 (w/ English Abstract page).

Korean Patent Application No. 10-2000-0054161 to Samsung Electronics Co., Ltd., having Publication date of Mar. 21, 2002 (w/ English Abstract page).

Korean Patent Application No. 10-2001-0036093 to Samsung Electronics Co., Ltd., having Publication date of Jan. 6, 2003 (w/ English Abstract page).

Japanese Patent No. JP63061526 to NEC Corp., having Publication date of Mar. 17, 1988 (w/ English Abstract page).

* cited by examiner 200
201
202
203
211
212
213
214
221
222
223
224
231
232
233
234
235
236
VDD
P31
P32
P33
N31
RCTLB
RCTL
COMMAND DECODER
241
READ OR WRITE
CONTROL SIGNAL GENERATING UNIT
242
COLUMN DECODER
246
SENSE AMPLIFIER
245
MEMORY CELL ARRAY
243
ROW DECODER
244
INPUT/ OUTPUT CONTROL CIRCUIT
247

300
301
302
311
312
313
314
SIG1
VDD
N41
320
INTERNAL CIRCUIT
CTL
333
334
335
VDD
P41
N42
50
332
SIG2
331

400
401
402
411
412
413
414
420
INTERNAL CIRCUIT
431
432
433
434
435
SIG1
SIG2
VDD
P51
P52
N51
60
CTL

MEMORY DEVICE WITH DIFFERENT TERMINATION UNITS FOR DIFFERENT SIGNAL FREQUENCIES

This application claims priority to Korean Patent Application No. 2004-009940, filed on Feb. 16, 2004 in the Korean Intellectual Property Office, the disclosure of which is incorporated herein in its entirety by reference.

BACKGROUND OF THE INVENTION

1. Field of the Invention

The present invention relates generally to semiconductor memory devices, and more particularly, to termination units for such memory devices.

2. Description of the Related Art

With increase in data transfer rate between a semiconductor memory device and a memory controller, interface techniques for reducing distortion of transferred data and for more accurate transfer of data are desired. Examples of such interface techniques include a low voltage transistor-transistor logic (LVTTL) interface technique and a stub-series terminated logic (SSTL) interface technique.

For the LVTTL interface technique, a synchronous dynamic random access memory (SDRAM) and a memory controller are directly connected to each other on a printed circuit board. The LVTTL interface technique is typically used for an SDRAM having an operating frequency of 100 MHz. On the other hand, for the SSTL interface technique, a termination circuit is formed on a main board for impedance matching between a transmission signal line and a semiconductor device connected to the transmission signal line. The SSTL interface technique is typically used for a double data rate (DDR) SDRAM having an operating frequency of 200 MHz or more.

However, when the aforementioned interface techniques are used for a memory device having an operating frequency of 400 MHz or more, signal distortion tends to occur on the data transfer lines. Thus, on-die termination (ODT) techniques are used for minimizing distortion of transmission signals by providing termination units at insides of a memory device and a memory controller. Different types of ODT are used depending on the kind of memory device to which the ODT is applied. For example, an open-drain type ODT is used in a graphic double data rate 3 (GDDR3) SDRAM and a rambus dynamic random access memory (RDRAM). On the other hand, a push-pull type ODT is used in a GDDR2 SDRAM.

The open-drain type ODT and the push-pull type ODT are now described with reference to FIGS. 1A, 1B, 2A, and 2B. FIGS. 1A and 1B are circuit diagrams with components for conventional termination units and input buffers. FIG. 1A shows an open-drain type termination unit 14 and an input buffer 11, and FIG. 1B shows a push-pull type termination unit 21, an input buffer 25, and an output buffer 26.

The open-drain type termination unit 14 of FIG. 1A advantageously has lower power consumption, but disadvantageously has higher signal distortion, compared to the push-pull type termination unit 21 of FIG. 1B. On the other hand, the push-pull type termination unit 21 of FIG. 1B is particularly advantageous for memory devices operating with higher frequencies because signal distortion is smaller, but disadvantageously has higher power consumption.

FIGS. 2A and 2B illustrate signals S1 and S2 output from the input buffers 11 and 25 of FIGS. 1A and 1B, respectively. Referring to FIGS. 2A and 2B, the output signal S1 of the input buffer 11 coupled to the termination unit 14 of the open-drain type is more distorted (i.e., has higher signal distortion) than the output signal S2 of the input buffer 25 coupled to the termination unit 21 of the push-pull type. The term signal distortion generally refers to an indication of a level of deviation of a signal from a desired waveform of the signal.

In the prior art, termination units of the same type are connected to all input signal lines and data input/output signal lines of conventional semiconductor memory devices. For example, in a semiconductor memory device requiring transmission signals with high quality, termination units of the push-pull type having higher power consumption but lower signal distortion are connected to all the input signal lines and the data input/output signal lines. On the other hand, in a semiconductor memory device requiring low power consumption, termination units of the open-drain type with lower power consumption but higher signal distortion are connected to all the input signal lines and the data input/output signal lines.

Typically, frequency components of the input signals of a semiconductor memory device are different depending on the kinds of the input signals. For example, data signals typically have double the frequency of command signals or address signals. However, semiconductor memory devices of the prior art disadvantageously use termination units of the same type for all the input signal lines and the data input/output signal lines. When termination units of the push-pull type are used for all the signal lines of a semiconductor memory device for lower signal distortion, power consumption is disadvantageously increased. On the contrary, when termination units of the open-drain type are used for all the signal lines for lower power consumption, signal distortion is disadvantageously increased.

SUMMARY OF THE INVENTION

Accordingly, in a general aspect of the present invention, both signal distortion and power consumption are minimized by using termination units of different types for input signals of different frequencies for the semiconductor memory device.

In one general embodiment of the present invention, a memory device includes a first termination unit coupled to a first pin for receiving a first signal having a first frequency component. The memory device also includes a second termination unit coupled to a second pin for receiving a second signal having a second frequency component higher than the first frequency component. The first termination unit is a different type from the second termination unit that provides less signal distortion than the first termination unit.

In another embodiment of the present invention, the memory device further includes a first input/output pad coupled to a first input/output buffer via a first signal line having the first termination unit coupled thereto. In addition, the memory device includes a second input/output pad coupled to a second input/output buffer via a second signal line having the second termination unit coupled thereto.

In an example embodiment of the present invention, the first termination unit is of an open-drain type, and the second termination unit is of a push-pull type. In that case, the first termination unit is implemented with one of an NMOS transistor or a PMOS transistor.

In a further embodiment of the present invention, the memory device includes a command decoder that outputs one of a read-out command signal and a write command signal in response to external control signals. The second termination unit is enabled or disabled depending on which of the read-out command signal and the write command signal is output by the command decoder. For example, the second termination unit of the push-pull type includes NMOS and PMOS transistors that are turned on when the write command signal is output by the command decoder and turned off when the read-out command signal is output by the command decoder.

In yet another embodiment of the present invention, the memory device includes a third termination unit coupled to a third pin for receiving a third signal having a third frequency component that is lower than the second frequency component. Additionally, the third termination unit is of the same type as the first termination unit, and the memory device further includes a third input/output pad coupled to a third input/output buffer via a third signal line having the third termination unit coupled thereto.

In one example embodiment of the present invention having three termination units, the first signal received by the first termination unit is an external control signal, the second signal received by the second termination unit is a data signal, and the third signal received by the third termination unit is an address signal.

In such an example embodiment of the present invention having the three termination units, the first and third termination units are of an open-drain type, and the second termination unit is of a push-pull type.

In one example embodiment, each of the first and third termination units that are of the open-drain type may include an NMOS transistor or a PMOS transistor. Alternatively, the first termination unit includes an NMOS transistor, and the third termination unit includes a PMOS transistor. In another embodiment, the first termination unit includes a PMOS transistor, and the third termination unit includes an NMOS transistor.

The present invention is practiced to particular advantage when the memory device is an integrated circuit fabricated on a semiconductor substrate. Furthermore, in another embodiment, the memory device is part of a memory system also having a memory controller. In that case, the memory device further includes an internal circuit coupled to the signal lines of the first, second, and third termination units for receiving the signals from the memory controller.

In this manner, the memory device and system of the present invention use different termination units of different types for different frequencies of the input signals. When an input signal has a higher frequency, the termination unit of the push-pull type is used for providing less signal distortion for such a higher frequency input signal. On the other hand, when the input signal has a lower frequency, the termination unit of the open-drain type is used for lower power consumption since signal distortion is already less for input signals of lower frequency. Thus, both signal distortion and power consumption are minimized for the memory device and system according to embodiments of the present invention.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, 6, and 7 refer to elements having similar structure and/or function.

DETAILED DESCRIPTION OF THE INVENTION

Figure 1A:
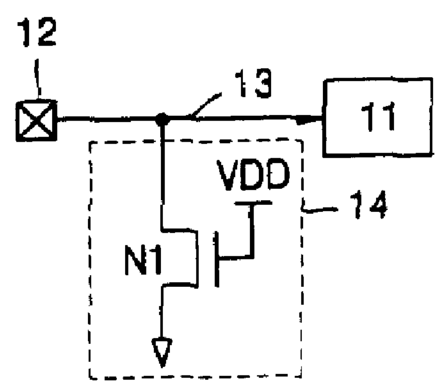
FIGS. 1A and 1B are circuit diagrams showing conventional termination units and input buffers.
Figure 1B:
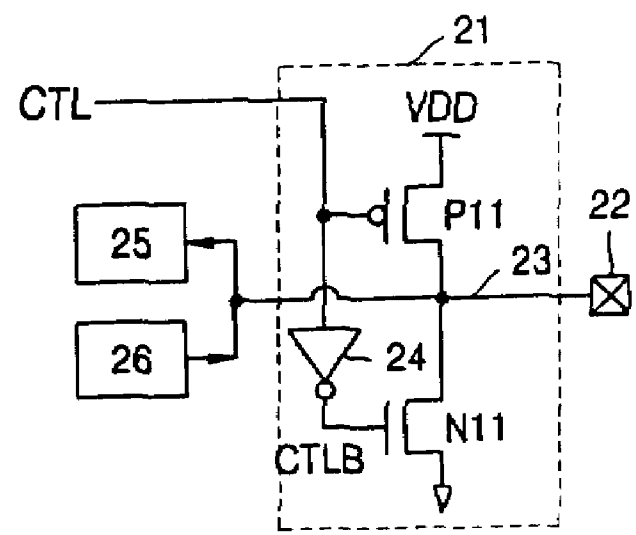
Figure 2A:
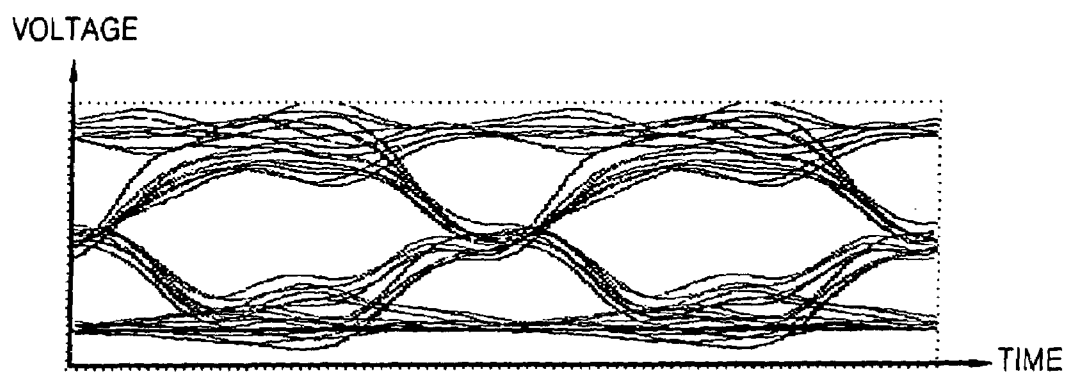
FIGS. 2A and 2B illustrate waveforms of signals output from the input buffers of FIGS. 1A and 1B, respectively.
Figure 2B:
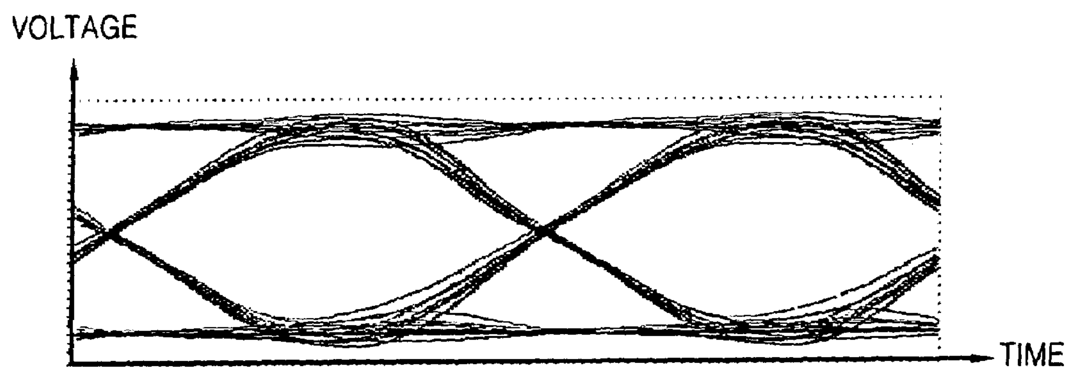
Figure 3:
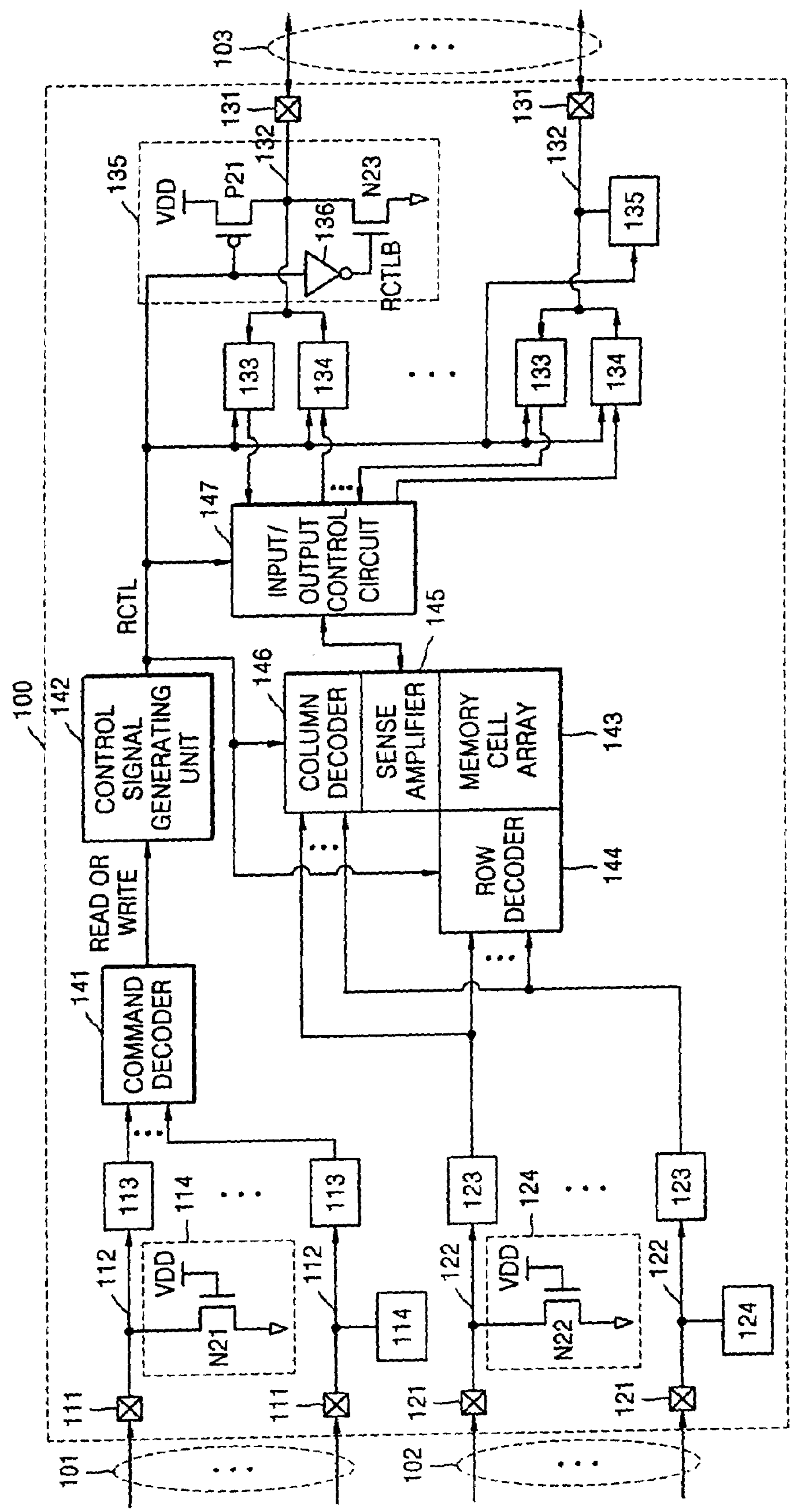
FIG. 3 is a diagram illustrating a semiconductor memory device using termination units of different types, according to an embodiment of the present invention.

FIG. 3 is a diagram illustrating a semiconductor memory device 100 according to an embodiment of the present invention. The semiconductor memory device 100 includes components fabricated as an integrated circuit on a semiconductor substrate such as a silicon substrate in one example embodiment of the present invention. For example, the dashed lines in FIG. 3 may out-line the semiconductor substrate having the components of the memory device 100 fabricated therein.

Referring to FIG. 3, the semiconductor memory device 100 comprises control pins 101, address pins 102, and data pins 103. Each of the control pins 101 is coupled to a respective one of a first set of input/output pads 111, and each of the data pins 103 is coupled to a respective one of a second set of input/output pads 131. Each of the address pins 102 is coupled to a respective one of a third set of input/output pads 121.

The semiconductor memory device 100 further comprises external control signal input buffers 113, address signal input buffers 123, data signal input buffers 133, and data signal output buffers 134. The semiconductor memory device 100 also comprises first to third termination units 114, 135, 124, a command decoder 141, a control signal generating unit 142, a memory cell array 143, a row decoder 144, a sense amplifier 145, a column decoder 146, and an input/output control circuit 147.

The external control signal input buffers 113 output control signals (for example, /CS, /RAS, /CAS, /WE) (not shown) received externally through the control pins 101 and the first input/output pads 111 to the command decoder 141. Because the first set of input/output pads 111 just receive signals from the control pins 101, the first set of input/output pads 111 are just input pads in the embodiment of FIG. 3.

The command decoder 141 generates a write command signal, WRITE, or a read-out command signal, READ, in response to the control signals received from the external control signal input buffers 113. The control signal generating unit 142 generates a data input/output control signal RCTL in response to the write command signal WRITE or the read-out command signal READ. More specifically, the control signal generating unit 142 enables the data input/output control signal RCTL to a high level in response to the read-out command signal READ. Alternatively, the control signal generating unit 142 disables the data input/output control signal RCTL to a low level in response to the write command signal WRITE.

The data input/output control signal, RCTL, controls operation of the row decoder 144, the column decoder 146, the input/output control circuit 147, the data signal input buffers 133, the data signal output buffers 134, and the second termination units 135. Such components are core circuits of the memory device 100.

The address signal input buffers 123 output row address signals (not shown) and column address signals (not shown) received externally through the address pins 102 and the third set of input/output pads 121 to the row decoder 144 and the column decoder 146, respectively. Because the third set of input/output pads 121 just receive signals from the address pins 101, the third set of input/output pads 121 are just input pads in the embodiment of FIG. 3.

The row decoder 144 decodes the row address signals, and activates relevant word lines of the memory cell array 143. The column decoder 146 decodes the column address signals, and enables relevant column select lines of the memory cell array 143. The sense amplifier 145 senses, amplifies, and outputs data read out from selected memory cells. The input/output control circuit 147 transfers the read-out data amplified by the sense amplifier 145 to the data signal output buffers 134, and transfers write data received from the data signal input buffers 133 to the memory cell array 143 through the sense amplifier 145.

In addition, each external control signal input buffer 113 is coupled to a respective first input pad 111 via a respective first signal line 112. Each first termination unit 114 is coupled to a respective first signal line 112. Similarly, each address signal input buffer 123 is coupled to a respective third input/output pad 121 via a respective third signal line 122. Each third termination unit 124 is coupled to a respective third signal line 122. Furthermore, each set of data signal input buffer 133 and data signal output buffer 134 is coupled to a respective second input/output pad 131 via a second signal line 132. Each second termination unit 135 is coupled to a respective second signal line 132.

The first to third termination units 114, 135, 124 are provided for impedance matching of the first to third signal lines 112, 132, 122, respectively. The first termination units 114 and the third termination units 124 are each implemented as an open-drain type, in one embodiment of the present invention. Each of the first termination units 114 is implemented with a respective NMOS transistor N21, and each of the third termination units 124 is implemented with a respective NMOS transistor N22, in the embodiment of FIG. 3.

Further referring to FIG. 3, an internal voltage VDD is coupled to the gate of the NMOS transistor N21 having the drain coupled to its respective first signal line 112 and having the source coupled to a ground node. Similarly, the internal voltage VDD is coupled to the gate of the NMOS transistor N22 having the drain coupled to its respective third signal line 122 and having the source coupled to the ground node. The NMOS transistors N21, N22 are turned on in response to the internal voltage VDD when a power source of the semiconductor memory device 100 is turned on, and thereafter remains turned-on until such a power source is turned off.

The second termination units 135 are each implemented as a push-pull type, in one embodiment of the present invention. Each second termination unit 135 has an NMOS transistor N23, a PMOS transistor P21, and an inverter 136. The internal voltage VDD is coupled to the source of the PMOS transistor P21 having the drain coupled to its respective second signal line 132 and having the gate coupled to receive the data input/output control signal RCTL.

The inverter 136 inverts the data input/output control signal RCTL, and outputs the inverted data input/output control signal RCTLB. The drain of the NMOS transistor N23 is coupled to the second signal line 132. The gate of the NMOS transistor N23 is coupled to the inverted data input/output control signal RCTLB. The source of the NMOS transistor N23 is coupled to the ground node.

The PMOS transistor P21 is turned on or off in response to the data input/output control signal RCTL. That is, the PMOS transistor P21 is turned on when the data input/output control signal RCTL has a low level, and is turned off when the data input/output control signal RCTL has a high level. The NMOS transistor N23 is turned on or off in response to the inverted data input/output control signal RCTLB. That is, the NMOS transistor N23 is turned on when the inverted data input/output control signal RCTLB has a high level, and is turned off when the inverted data input/output control signal RCTLB has a low level.

The data input/output control signal RCTL is enabled to a high level when the read-out command signal READ is output from the command decoder 141, and is disabled to a low level when the write command signal WRITE is output from the command decoder 141. Therefore, the PMOS transistor P21 and the NMOS transistor N23 are turned on when the write command signal WRITE is output from the command decoder 141, in one embodiment of the present invention.

The second termination units 135 of FIG. 3 are controlled by the data input/output control signal RCTL in the example embodiment of FIG. 3. However, the second termination units 135 may also be controlled in other ways. For example, the ground voltage may be coupled to the gate of the PMOS transistor P21, and the internal voltage VDD may be coupled to the gate of the NOMS transistor N23, for turning on such transistors P21 and N23. In addition, the first and third termination units 114, 124 may also be controlled by the data input/output control signal RCTL in alternative embodiments of the present invention.

In the embodiment of FIG. 3, frequency components of the external control signals and the address signals transmitted through the first and third signal lines 112 and 122 are different from a frequency component of the data signals transmitted through the second signal lines 132. Thus, termination units 114, 124, and 135 of different types are used according to the embodiments of the present invention.

For example, a respective frequency component of each of the external control signals and the address signals received through the first and third signal lines 112, 122 is lower than a frequency component of the data signals input or output through the second signal lines 132. Table 1 shown below indicates an example of the frequencies of important input and output signals of a semiconductor memory device.

TABLE 1

| Operating frequency of semiconductor memory device | Frequency of clock signal | Frequency of external control signal | Frequency of address signal | Frequency of data signal |
|---|---|---|---|---|
| 200 MHz | 200 MHz | 200 MHz | 200 MHz | 400 MHz |
| 300 MHz | 300 MHz | 300 MHz | 300 MHz | 600 MHz |
| 500 MHz | 500 MHz | 500 MHz | 500 MHz | 1000 MHz |

As shown in Table 1, the data signals require double an operating speed of the other signals. As a result, to reduce signal distortion during transmission of the data signals, the second termination units 135 are each implemented as a push-pull type. The term signal distortion generally refers to an indication of a level of deviation of a signal from a desired waveform of the signal. On the other hand, since the frequencies of the external control signals and the address signals are lower, insignificant signal distortion is generated even when the first and third termination units 114 and 124 are each implemented as an open-drain type.

In this manner, the second termination units 135 each of a push-pull type are coupled to the second signal lines 132 (having data signals of a higher frequency applied thereon). The first and third termination units 114 and 124 each of an open-drain type are coupled to the first and third signal lines 112 and 122 (having the external control signals and the address signals of lower frequency applied thereon). Therefore, in the semiconductor memory device 100 according to the embodiment of FIG. 3, signal distortion of the transmitted data signals is minimized, while at the same time, overall power consumption is also minimized.

FIG. 3 illustrates an example embodiment with the first and third termination units 114 and 124 being implemented with the NMOS transistors N21, N22. However, the first and third termination units 114 and 124 of the open-drain type may be implemented with other types of transistors.

Figure 4:
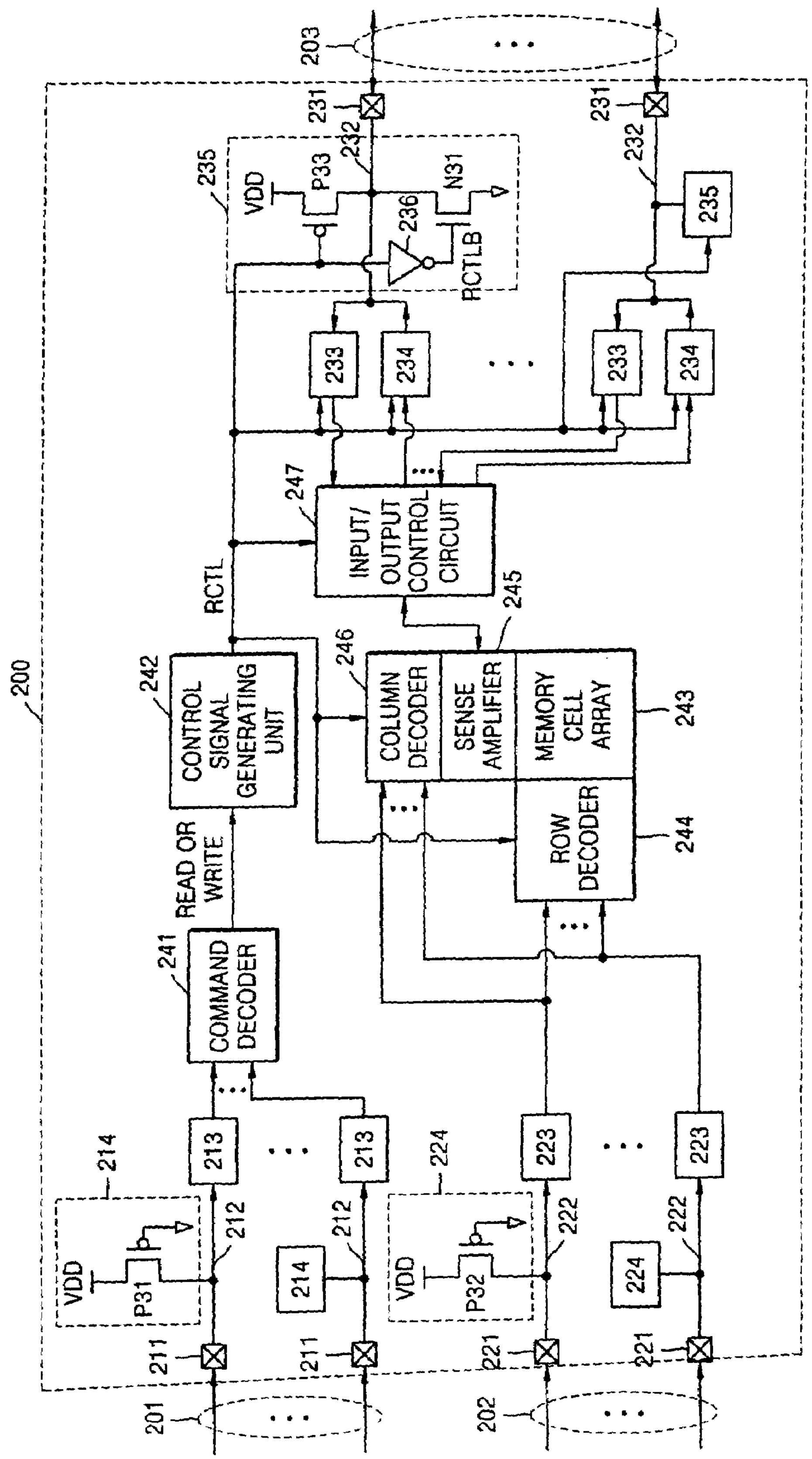
FIG. 4 is a diagram illustrating a semiconductor memory device according to another embodiment of the present invention.

For example, FIG. 4 is a diagram illustrating a semiconductor memory device 200 according to another embodiment of the present invention. Referring to FIG. 4, the semiconductor memory device 200 comprises control pins 201, address pins 202, data pins 203, first input pads 211, second input/output pads 231, and third input pads 221. One of the control pins 201 is coupled to a respective one of the first input pads 211, one of the address pins 202 is coupled to a respective one of the third input pads 221, and one of the data pins 203 is coupled to a respective one of the second input/output pads 231.

The semiconductor memory device 200 further comprises external control signal input buffers 213, address signal input buffers 223, data signal input buffers 233, data signal output buffers 234, first to third termination units 214, 235, 224, a command decoder 241, a control signal generating unit 242, a memory cell array 243, a row decoder 244, a sense amplifier 245, a column decoder 246, and an input/output control circuit 247.

The semiconductor memory device 200 of FIG. 4 operates similarly to the semiconductor memory device 100 of FIG. 3, as already described herein. However, each of the first and third termination units 214 and 224 of the semiconductor memory device 200 of FIG. 4 is a termination unit of an open-drain type comprising a PMOS transistor P31 or P32 instead of an NMOS transistor.

The internal voltage VDD is coupled to the source of the PMOS transistor P31 having the gate coupled to the ground node and having the drain coupled to the first signal line 212. The internal voltage VDD is coupled to the source of the PMOS transistor P32, having the gate coupled to the ground node and having the drain coupled to the third signal line 222. The PMOS transistors P31 and P32 are turned on in response to the ground voltage when a power source of the semiconductor memory device 200 is turned on, and thereafter remains turned-on until such a power source is turned off.

As described above, the second termination units 235 of the push-pull type are each connected to the second signal lines 232 (having data signals of higher frequency applied thereon). The first and third termination units 214 and 224 of the open-drain type are connected to the first and third signal lines 212, 222 (having the external control signals and the address signals of lower frequency applied thereon). Therefore, in the semiconductor memory device 200, the signal distortion of the transmitted signals is reduced, and at the same time, overall power consumption is minimized.

FIGS. 3 and 4 illustrate embodiments whereby the first and third termination units 214 and 224 are comprised of either all NMOS transistors or all PMOS transistors. However, each of the first and third termination units 214 and 224 of the open-drain type may be implemented with any of a PMOS transistor or an NMOS transistor. For example, each of the first termination units 214 may be implemented with an NMOS transistor as shown in FIG. 3, while each of the third termination units 224 is implemented with a PMOS transistor as shown in FIG. 4. Conversely, each of the first termination units 214 may be implemented with a PMOS transistor as shown in FIG. 4, while each of the third termination units 224 is implemented with an NMOS transistor as shown in FIG. 3.

Figure 5:
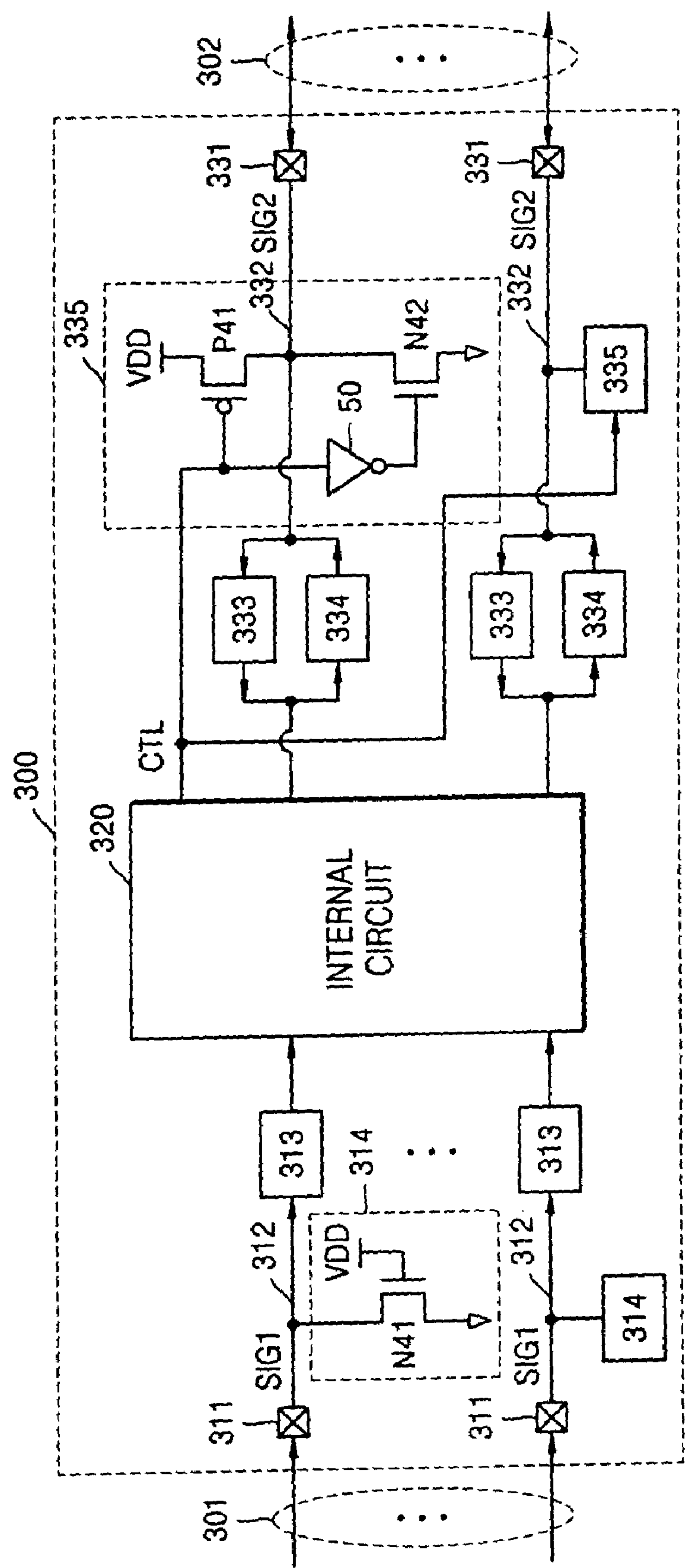
FIG. 5 is a diagram illustrating a semiconductor memory device according to still another embodiment of the present invention.

FIG. 5 is a diagram illustrating a semiconductor memory device 300 according to still another embodiment of the present invention. Referring to FIG. 5, the semiconductor memory device 300 includes first pins 301, second pins 302, first pads 311, and second pads 331. Each of the first pads 311 is coupled to a respective one of the first pins 301, and each of the second pads 331 is coupled to a respective one of the second pins 302. The semiconductor memory device 300 further includes first input buffers 313, second input buffers 333, output buffers 334, first termination units 314, second termination units 335, and an internal circuit 320.

Each of the first input buffers 313 is coupled to a respective one of the first pads 311 via a corresponding one of first signal lines 312 having a respective one of the first termination units 314 coupled thereto. Each of the first signal lines 312 transmits a respective first signal SIG1 received through a respective one of the first pins 301 and a respective one of the first pads 311 to a respective one of the first input buffers 313.

A set of one of the second input buffers 333 and one of the output buffers 334 is connected to a respective one of the second pads 331 through a respective one of the second signal lines 332. Each of the second signal lines 332 has a respective one of the second termination units 335 coupled thereto. Each of the second signal lines 332 transmits a respective second signal SIG2 received through a respective one of the second pins 302 and a respective one of the second pads 331 to a respective one of the second input buffers 333.

In one embodiment of the present invention, the frequency of a second signal SIG2 associated with a second pin 302 is higher than the frequency of the first signal SIG1 associated with a first pin 301. For example, such a second signal SIG2 is a data signal having higher frequency than the first signal SIG1 that is an address signal.

The first and second termination units 314 and 335 provided impedance matching for the first and second signal lines 312 and 332, respectively. Each of the first termination units 314 is implemented as an open-drain type, similar to the first termination unit 114 of FIG. 3. Each of the second termination units 335 are implemented as a push-pull type, similar to the second termination unit 135 of FIG. 3.

However in FIG. 5, the second termination units 335 are enabled or disabled in response to a generalized control signal CTL received from the generalized internal circuit 320. For example, a data write command signal is used as the control signal CTL. In that case, when the second signals SIG2 (such as data signals for example) are received through the second pins 302, the data write command signal is enabled (to a low level). As a result, the second termination units 335 are enabled only when the second signals SIG2 are received through the second pins 302 in such an example.

Figure 6:
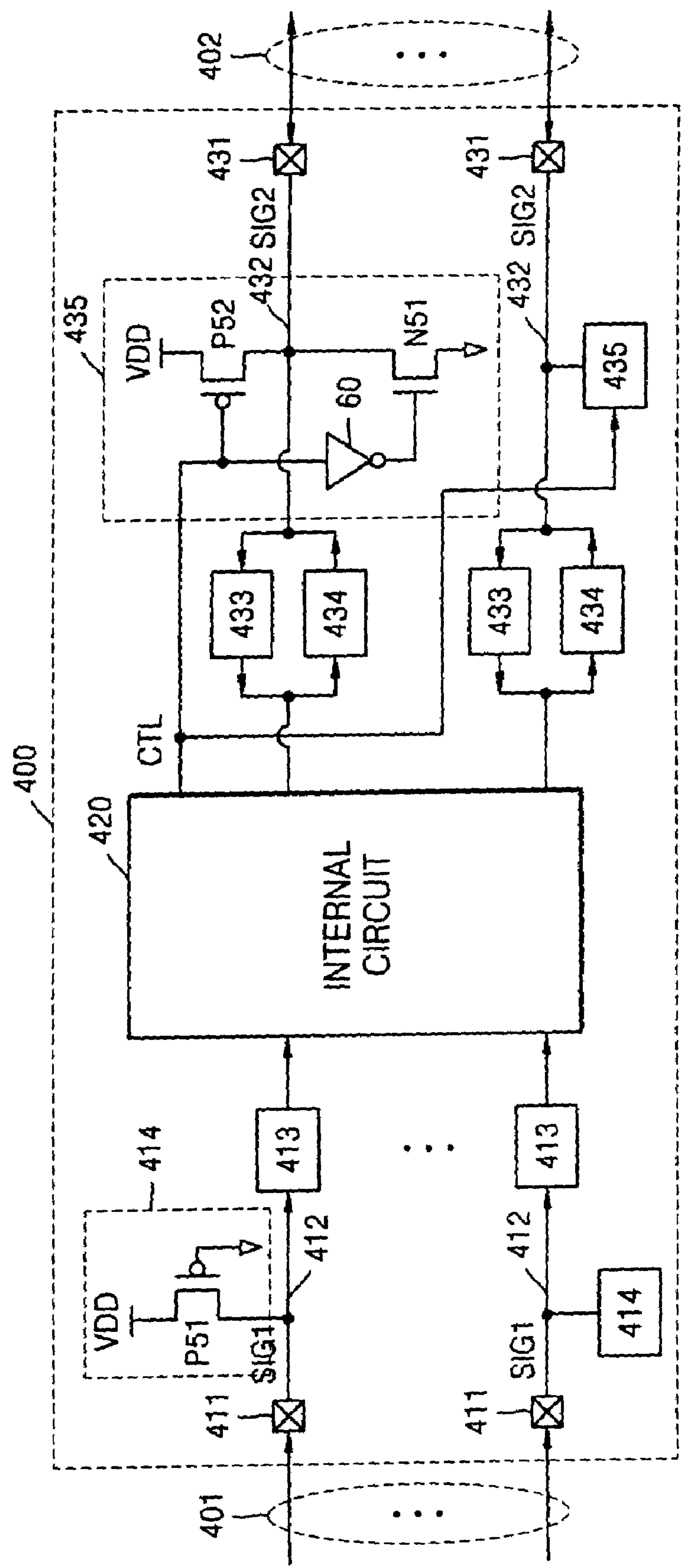
FIG. 6 is a diagram illustrating a semiconductor memory device according to still another embodiment of the present invention.

FIG. 6 is a diagram illustrating a semiconductor memory device 400 according to still another embodiment of the present invention. Referring to FIG. 6, the semiconductor memory device 400 comprises first pins 401, second pins 402, first pads 411, and second pads 431. Each of the first pads 411 is coupled to a respective one of the first pins 401, and each of the second pads 431 is coupled to a respective one of the second pins 402. The semiconductor memory device 400 further comprises first input buffers 413, second input buffers 433, output buffers 434, first termination units 414, second termination units 435, and an internal circuit 420.

The semiconductor memory device 400 of FIG. 6 is substantially similar to the semiconductor memory device 300 of FIG. 5. However, each of the first termination units 414 of the semiconductor memory device 400 in FIG. 6 is an open-drain type implemented with a PMOS transistor P51, which operates similarly to the first termination unit 214 described with reference to FIG. 4.

Figure 7:
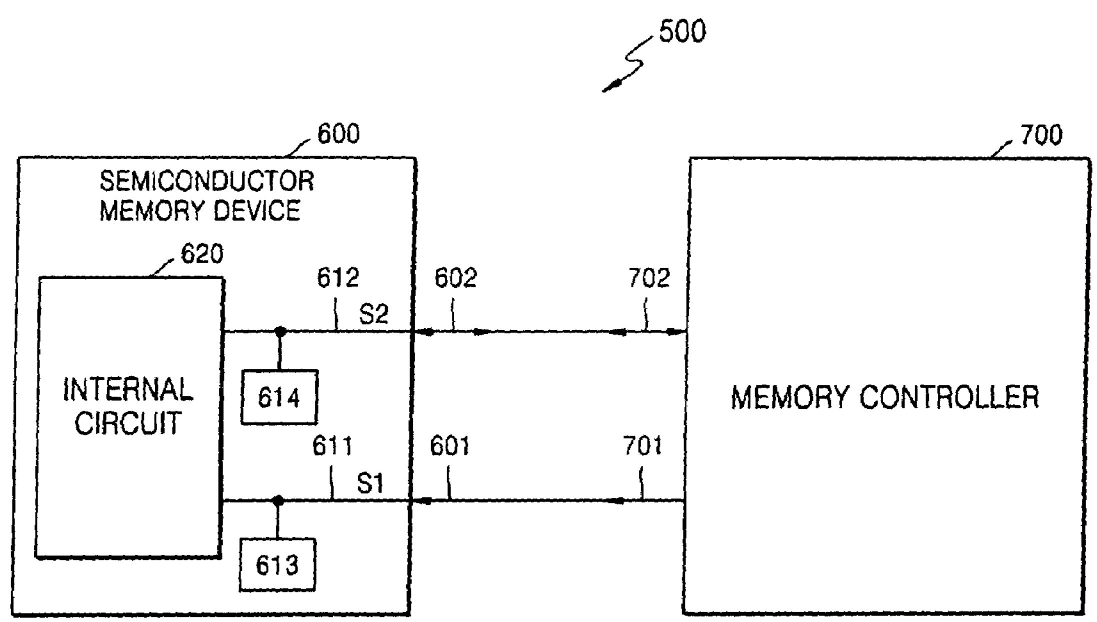
FIG. 7 is a diagram illustrating a semiconductor memory system according to an embodiment of the present invention.

FIG. 7 is a diagram illustrating a semiconductor memory system 500 according to an embodiment of the present invention. Referring to FIG. 7, the semiconductor memory system 500 comprises a semiconductor memory device 600 and a memory controller 700. The semiconductor memory device 600 comprises a first pin 601, a second pin 602, a first termination unit 613, a second termination unit 614, and an internal circuit 620.

The first pin 601 is coupled to the internal circuit 620 through a first signal line 611, and the second pin 602 is coupled to the internal circuit 620 through a second signal line 612. The first pin 601 is coupled to an output pin 701 of the memory controller 700, and the second pin 602 is coupled to an input/output pin 702 of the memory controller 700. The first termination unit 613 is coupled to the first signal line 611, and the second termination unit 614 is coupled to the second signal line 612.

The first signal line 611 transmits a first signal S1 received from the memory controller 700 through the first pin 601 to the internal circuit 620. The second signal line 612 transmits a second signal S2 received from the memory controller 700 through the second pin 602 to the internal circuit 620. Here, a frequency of the second signal S2 is higher than a frequency of the first signal S1. For example, the second signal S2 is a data signal, and the first signal S1 is an address signal.

The first and second termination units 613 and 614 provided impedance matching for the first and second signal lines 611 and 612, respectively. The first termination unit 613 is implemented as an open-drain type, in one embodiment of the present invention, similar to those 314 and 414 described with reference to FIG. 5 or 6.

The second termination unit 614 is implemented as a push-pull type, similar to those 335 described with reference to FIG. 5. However, the second termination unit 614 of FIG. 7 is different from the termination unit 335 of FIG. 5 in that the control signal CTL is not input to the second termination unit 614 in FIG. 7. Rather, the second termination unit 614 of FIG. 7 remains turned-on during operation of the semiconductor memory device 600.

As described above, since the semiconductor memory device 600 and the semiconductor memory system 500 of an embodiment of the present invention comprise the termination units of different types depending on the frequencies of the input signals received through the signal lines, signal distortion and power consumption are minimized.

While the present invention has been particularly shown and described with reference to exemplary embodiments thereof, it will be understood by those skilled in the art that various changes in form and details may be made therein without departing from the spirit and scope of the present invention as defined by the appended claims.

For example, input pads 111, 121 211, 221, 311, and 411 with just input buffers 113, 123, 213, 223, 313, and 413 are illustrated in FIGS. 3, 4, 5, and 6, corresponding to the termination units of the open-drain type. However, the present invention may also be practiced when termination units of the open-drain type are associated with the input portions of with input/out pads and input/output buffer pairs. In addition, any numbers described and illustrated herein are by way of example only. For example, more numerous types of termination units may be used within the semiconductor memory device than the examples of the open-drain type and the push-pull type.

What is claimed is:

1. A memory device, comprising:

a first termination unit coupled to a first pin of the memory device and for receiving a first signal having a first frequency component; and a second termination unit coupled to a second pin of the memory device and separate from the first pin and for receiving a second signal having a second frequency component higher than the first frequency component;

wherein the first termination unit is a different type from the second termination unit that provides less signal distortion than the first termination unit, and wherein the first pin and the second pin are in separate signal paths such that the first pin does not receive the second frequency component of the second signal and such that the second pin does not receive the first frequency component of the first signal.

2. The memory device of claim 1, further comprising:

a first input/output pad coupled to a first input/output buffer via a first signal line having the first termination unit coupled thereto; and a second input/output pad coupled to a second input/output buffer via a second signal line having the second termination unit coupled thereto.

3. The memory device of claim 1, wherein the first termination unit is of an open-drain type.

4. The memory device of claim 3, wherein the first termination unit includes one of an NMOS transistor or a PMOS transistor.

5. The memory device of claim 3, wherein the second termination unit is of a push-pull type.

6. The memory device of claim 1, wherein the second termination unit is of a push-pull type.

7. The memory device of claim 6, further comprising:

a command decoder that outputs one of a read-out command signal or a write command signal in response to external control signals;

wherein the second termination unit is enabled or disabled depending on which of the read-out command signal and the write command signal is output by the command decoder.

8. The memory device of claim 7, wherein the second termination unit includes NMOS and PMOS transistors that are turned on when the write command signal is output by the command decoder and turned off when the read-out command signal is output by the command decoder.

9. The memory device of claim 1, further comprising:

a third termination unit coupled to a third pin for receiving a third signal having a third frequency component that is lower than the second frequency component, wherein the third termination unit is of the same type as the first termination unit.

10. The memory device of claim 9, further comprising:

a third input/output pad coupled to a third input/output buffer via a third signal line having the third termination unit coupled thereto.

11. The memory device of claim 9, wherein the first signal is an external control signal, the second signal is a data signal, and the third signal is an address signal, for the memory device.

12. The memory device of claim 9, wherein the first and third termination units are of an open-drain type.

13. The memory device of claim 12, wherein each of the first and third termination units includes an NMOS transistor.

14. The memory device of claim 12, wherein each of the first and third termination units includes a PMOS transistor.

15. The memory device of claim 12, wherein the first termination unit includes an NMOS transistor, and the third termination unit includes a PMOS transistor.

16. The memory device of claim 12, wherein the first termination unit includes a PMOS transistor, and the third termination unit includes an NMOS transistor.

17. The memory device of claim 9, further comprising:

a command decoder that outputs one of a read-out command signal or a write command signal in response to external control signals;

wherein the second termination unit is enabled or disabled depending on which of the read-out command signal and the write command signal is output by the command decoder.

18. The memory device of claim 17, wherein the second termination unit is of a push-pull type.

19. The memory device of claim 18, wherein the second termination unit includes NMOS and PMOS transistors that are turned on when the write command signal is output by the command decoder and turned off when the read-out command signal is output by the command decoder.

20. The memory device of claim 1, wherein the memory device is an integrated circuit fabricated on a semiconductor substrate.

21. A memory system, comprising:

a memory controller; and a memory device comprising:

a first termination unit coupled to a first pin of the memory device for receiving a first signal having a first frequency component from the memory controller; and a second termination unit coupled to a second pin of the memory device and separate from the firs pin, with the second pin being for receiving a second signal from the memory controller, the second signal having a second frequency component higher than the first frequency component;

wherein the first termination unit is a different type from the second termination unit that provides less signal distortion than the first termination unit, and wherein the first pin and the second pin are in separate signal paths such that the first pin does not receive the second frequency component of the second signal and such that the second pin does not receive the first frequency component of the first signal.

22. The memory system of claim 21, wherein the memory device further comprises:

a first input/output pad coupled to a first input/output buffer via a first signal line having the first termination unit coupled thereto; and a second input/output pad coupled to a second input/output buffer via a second signal line having the second termination unit coupled thereto.

23. The memory system of claim 22, wherein the memory device further comprises an internal circuit coupled to the first and second signal lines for receiving the first and second signals from the memory controller.

24. The memory system of claim 21, wherein the first termination unit is of an open-drain type.

25. The memory system of claim 24, wherein the second termination unit is of a push-pull type.

26. The memory system of claim 21, wherein the second termination unit is of a push-pull type.

27. The memory system of claim 21, wherein the first signal for the first termination unit is for one of a control signal or an address signal, and wherein the second signal for the second termination unit is for a data signal.

* * * * *